US012571841B2

(12) United States Patent
Pickerd et al.

(10) Patent No.: US 12,571,841 B2
(45) Date of Patent: Mar. 10, 2026

(54) GENERAL DIGITAL SIGNAL PROCESSING WAVEFORM MACHINE LEARNING CONTROL APPLICATION

(71) Applicant: Tektronix, Inc., Beaverton, OR (US)

(72) Inventors: John J. Pickerd, Hillsboro, OR (US); Mark Anderson Smith, Portland, OR (US); Kan Tan, Portland, OR (US); Evan Douglas Smith, Portland, OR (US); Justin E. Patterson, Honolulu, HI (US); Heike Tritschler, Louisville, CO (US)

(73) Assignee: Tektronix, Inc., Beaverton, OR (US)

( * ) Notice: Subject to any disclaimer, the term of this patent is extended or adjusted under 35 U.S.C. 154(b) by 766 days.

(21) Appl. No.: 17/831,181

(22) Filed: Jun. 2, 2022

(65) Prior Publication Data

US 2022/0390515 A1 Dec. 8, 2022

Related U.S. Application Data

(60) Provisional application No. 63/197,282, filed on Jun. 4, 2021.

(51) Int. Cl.
G01R 31/3183 (2006.01)
G01R 31/317 (2006.01)
(Continued)

(52) U.S. Cl.
CPC .............. G01R 31/318314 (2013.01); G01R 31/31728 (2013.01); G01R 31/318307 (2013.01); G01R 31/31905 (2013.01); G06N 20/00 (2019.01)

(58) Field of Classification Search
CPC ...... G01R 31/31728; G01R 31/318307; G01R 31/318314; G01R 31/31905; G06N 20/00
See application file for complete search history.

(56) References Cited

U.S. PATENT DOCUMENTS 5,272,723 A 12/1993 Kimoto
5,397,981 A 3/1995 Wiggers
(Continued)

FOREIGN PATENT DOCUMENTS

CN 107342810 11/2019
EP 2743710 9/2018
(Continued)

OTHER PUBLICATIONS

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.
(Continued)

*Primary Examiner* — Michael J Dalbo
(74) *Attorney, Agent, or Firm* — Miller Nash LLP; Andrew J. Harrington

(57) ABSTRACT

A test and measurement system includes a machine learning system configured to communicate with a test automation system, a user interface configured to allow a user to provide one or more user inputs and to provide results to the user, and one or more processors, the one or more processors configured to execute code that causes the one or more processors to receive one or more user inputs through the user interface, the one or more user inputs at least identifying a selected machine learning system configuration to be used to configure the machine learning system, receive a waveform created by operation of a device under test, apply the configured machine learning system to analyze the waveform, and provide an output of predicted metadata about the waveform.

22 Claims, 17 Drawing Sheets

(51) Int. Cl.
  *G01R 31/319*     (2006.01)
  *G06N 20/00*     (2019.01)

(56)          References Cited

U.S. PATENT DOCUMENTS

| | | | |
|---|---|---|---|
| 5,440,566 A * | 8/1995 | Spence | G01R 31/309 |
| | | | 356/73 |
| 5,594,655 A | 1/1997 | Berchin | |
| 6,384,995 B1 * | 5/2002 | Smith | G11B 27/36 |
| | | | 360/25 |
| 6,807,496 B2 | 10/2004 | Pickerd | |
| 7,181,146 B1 | 2/2007 | Yorks | |
| 7,298,463 B2 | 11/2007 | French | |
| 8,583,395 B2 | 11/2013 | Dybsetter | |
| 8,861,578 B1 | 10/2014 | Lusted | |
| 9,059,803 B2 | 6/2015 | Detofsky | |
| 9,130,751 B2 | 9/2015 | Zivny | |
| 9,337,993 B1 | 5/2016 | Lugthart | |
| 9,548,858 B1 | 1/2017 | Cirit | |
| 9,699,009 B1 | 7/2017 | Ainspan | |
| 9,709,605 B2 | 7/2017 | Alley | |
| 10,171,161 B1 | 1/2019 | Cote | |
| 10,209,276 B2 | 2/2019 | Tan | |
| 10,236,982 B1 | 3/2019 | Zhuge | |
| 10,270,527 B1 | 4/2019 | Mentovich | |
| 10,396,897 B1 | 8/2019 | Malave | |
| 10,585,121 B2 | 3/2020 | Absher | |
| 10,727,973 B1 | 7/2020 | Kumar | |
| 10,852,323 B2 | 12/2020 | Schaefer | |
| 10,863,255 B2 | 12/2020 | Zhang | |
| 11,005,697 B2 | 5/2021 | Liston | |
| 11,040,169 B2 | 6/2021 | Jung | |
| 11,095,314 B2 | 8/2021 | Medard | |
| 11,177,986 B1 | 11/2021 | Ganesan | |
| 11,233,561 B1 | 1/2022 | O'Shea | |
| 11,237,190 B2 | 2/2022 | Rule | |
| 11,336,378 B2 | 5/2022 | Bottoni | |
| 11,388,081 B1 | 7/2022 | Sommers | |
| 11,476,967 B2 | 10/2022 | Geng | |
| 11,646,863 B2 | 5/2023 | Balan | |
| 11,695,601 B2 | 7/2023 | Sudhakaran | |
| 2002/0063553 A1 | 5/2002 | Jungerman | |
| 2003/0053170 A1 | 3/2003 | Levinson | |
| 2003/0208330 A1 | 11/2003 | Pickerd | |
| 2003/0220753 A1 | 11/2003 | Pickerd | |
| 2004/0032889 A1 | 2/2004 | Hidaka | |
| 2004/0121733 A1 * | 6/2004 | Peng | G01M 11/332 |
| | | | 455/66.1 |
| 2004/0131365 A1 | 7/2004 | Lee | |
| 2004/0136422 A1 | 7/2004 | Mahowald | |
| 2004/0165622 A1 | 8/2004 | Lu | |
| 2004/0168111 A1 * | 8/2004 | Arnold | G06F 11/3664 |
| | | | 714/E11.217 |
| 2004/0223544 A1 | 11/2004 | Upton | |
| 2004/0236527 A1 | 11/2004 | Felps | |
| 2005/0222789 A1 | 10/2005 | West | |
| 2005/0246601 A1 | 11/2005 | Waschura | |
| 2005/0249252 A1 | 11/2005 | Sanchez | |
| 2006/0120720 A1 | 6/2006 | Hauenschild | |
| 2007/0250570 A1 * | 10/2007 | Van Eyck | G06F 9/44505 |
| | | | 709/204 |
| 2008/0126001 A1 | 5/2008 | Murray | |
| 2008/0159737 A1 | 7/2008 | Noble | |
| 2008/0212979 A1 | 9/2008 | Ota | |
| 2009/0040335 A1 | 2/2009 | Ito | |
| 2011/0085793 A1 | 4/2011 | Oomori | |
| 2011/0161738 A1 | 6/2011 | Zhang | |
| 2011/0286506 A1 | 11/2011 | Libby | |
| 2012/0226727 A1 | 9/2012 | Zivny | |
| 2013/0046805 A1 | 2/2013 | Smith | |
| 2014/0093233 A1 | 4/2014 | Gao | |
| 2014/0163914 A1 | 6/2014 | Alley | |
| 2014/0254647 A1 * | 9/2014 | Stott | H04L 43/12 |
| | | | 375/224 |
| 2014/0343883 A1 | 11/2014 | Libby | |

| | | | |
|---|---|---|---|
| 2014/0347499 A1 * | 11/2014 | Gluskin | H04N 17/00 |
| | | | 348/194 |
| 2015/0003505 A1 | 1/2015 | Lusted | |
| 2015/0055694 A1 | 2/2015 | Juenemann | |
| 2015/0092829 A1 * | 4/2015 | Ali | H04L 25/03019 |
| | | | 375/232 |
| 2015/0207574 A1 | 7/2015 | Schoen | |
| 2015/0350042 A1 | 12/2015 | Zivny | |
| 2016/0127038 A1 * | 5/2016 | Liao | H01S 5/02438 |
| | | | 398/38 |
| 2016/0191168 A1 | 6/2016 | Huang | |
| 2016/0328501 A1 | 11/2016 | Chase | |
| 2018/0006721 A1 | 1/2018 | Ishizaka | |
| 2018/0045761 A1 | 2/2018 | Tan | |
| 2018/0074096 A1 | 3/2018 | Absher | |
| 2018/0204117 A1 | 7/2018 | Brevdo | |
| 2018/0219636 A1 | 8/2018 | Gale | |
| 2018/0356655 A1 | 12/2018 | Welch | |
| 2019/0038387 A1 | 2/2019 | Chu | |
| 2019/0180179 A1 * | 6/2019 | Beyene | G06Q 10/06 |
| 2019/0278500 A1 | 9/2019 | Lakshmi | |
| 2019/0332941 A1 | 10/2019 | Towal | |
| 2019/0370158 A1 | 12/2019 | Rivoir | |
| 2019/0370631 A1 | 12/2019 | Fais | |
| 2019/0391202 A1 * | 12/2019 | Chang | G01R 31/2813 |
| 2020/0035665 A1 | 1/2020 | Chuang | |
| 2020/0057824 A1 | 2/2020 | Yeh | |
| 2020/0166546 A1 | 5/2020 | O'Brien | |
| 2020/0195353 A1 | 6/2020 | Ye | |
| 2020/0229206 A1 | 7/2020 | Badic | |
| 2020/0313999 A1 | 10/2020 | Lee | |
| 2020/0335029 A1 | 10/2020 | Gao | |
| 2021/0041499 A1 | 2/2021 | Ghosal | |
| 2021/0105548 A1 | 4/2021 | Ye | |
| 2021/0111794 A1 | 4/2021 | Huang | |
| 2021/0160109 A1 | 5/2021 | Seol | |
| 2021/0167864 A1 | 6/2021 | Razzell | |
| 2021/0314081 A1 | 10/2021 | Shattil | |
| 2021/0389373 A1 | 12/2021 | Pickerd | |
| 2021/0390456 A1 | 12/2021 | Pickerd | |
| 2022/0070040 A1 | 3/2022 | Namgoong | |
| 2022/0076715 A1 | 3/2022 | Lee | |
| 2022/0092470 A1 * | 3/2022 | Jaeger | G06N 20/00 |
| 2022/0121388 A1 | 4/2022 | Woo | |
| 2022/0147614 A1 * | 5/2022 | Veller | G06N 20/00 |
| 2022/0182139 A1 | 6/2022 | Zhang | |
| 2022/0199126 A1 | 6/2022 | Lee | |
| 2022/0200712 A1 | 6/2022 | Lillie | |
| 2022/0215865 A1 | 7/2022 | Woo | |
| 2022/0236326 A1 | 7/2022 | Schaefer | |
| 2022/0239371 A1 | 7/2022 | Xu | |
| 2022/0247648 A1 | 8/2022 | Pickerd | |
| 2022/0311513 A1 | 9/2022 | Pickerd | |
| 2022/0311514 A1 | 9/2022 | Smith | |
| 2022/0334180 A1 | 10/2022 | Pickerd | |
| 2022/0373597 A1 | 11/2022 | Agoston | |
| 2022/0373598 A1 | 11/2022 | Tan | |
| 2022/0385374 A1 | 12/2022 | Arikawa | |
| 2022/0390515 A1 | 12/2022 | Pickerd | |
| 2022/0393914 A1 | 12/2022 | Tan | |
| 2022/0407595 A1 * | 12/2022 | Varughese | H04B 10/0731 |
| 2023/0050162 A1 | 2/2023 | Tan | |
| 2023/0050303 A1 | 2/2023 | Pickerd | |
| 2023/0052588 A1 | 2/2023 | Sudhakaran | |
| 2023/0088409 A1 | 3/2023 | Parsons | |
| 2023/0098379 A1 | 3/2023 | Smith | |
| 2023/0194599 A1 | 6/2023 | Gilabert | |
| 2023/0228803 A1 | 7/2023 | Sun | |
| 2023/0239182 A1 | 7/2023 | Ikeda | |
| 2023/0299862 A1 | 9/2023 | O'Shea | |
| 2023/0306578 A1 | 9/2023 | Pickerd | |

FOREIGN PATENT DOCUMENTS

| | | |
|---|---|---|
| EP | 3936877 | 1/2022 |
| JP | 6560793 | 8/2019 |
| WO | 2021092156 | 5/2021 |

(56)            References Cited

FOREIGN PATENT DOCUMENTS

| WO | 2022171645 | 8/2022 |
| WO | 2022189613 | 9/2022 |

OTHER PUBLICATIONS

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

Wang et al., "Intelligent Constellation Diagram Analyzer Using Convolutional Neural Network-Based Deep Learning," Optics Express, Jul. 24, 2017, vol. 25, No. 15.

* cited by examiner

GENERAL DIGITAL SIGNAL PROCESSING WAVEFORM MACHINE LEARNING CONTROL APPLICATION

CROSS-REFERENCE TO RELATED APPLICATIONS

This disclosure claims benefit of U.S. Provisional Application No. 63/197,282, titled "GENERAL DIGITAL SIGNAL PROCESSING WAVEFORM MACHINE LEARNING SUPPORT APPLICATION," filed on Jun. 4, 2021, the disclosure of which is incorporated herein by reference in its entirety.

TECHNICAL FIELD

This disclosure relates to test and measurement systems and instruments, and more particularly to a machine learning platform for integrating machine learning into a test and measurement system.

BACKGROUND

Manufacturers of all different kinds of electrical and optical components have to test the components before sending them to their customers. Testing of optical and electrical components on manufacturing lines typically involves setting operating parameters for a component, testing it to gather output data, and then evaluating the output data to see if the component passes or fails. This process may occur multiple times for each component. This raises the cost of manufacturing for each component, multiplied by the number of components. This number can reach the hundreds of thousands of components.

Some manufacturers have provided data that indicates that testing of a single component may take up to 200 iterations in a worst-case example. The best-case example takes somewhere between three and five iterations. Reducing these iterations increases throughput and reduces costs.

Implementing a machine learning approach can improve this process. Machine learning systems have shown that they can speed up the selection of the operating parameters and providing the resulting measurements to the testing system. In addition, machine learning can assist in other environments for calibration, characterization, testing, tuning, etc. However, no machine learning platform currently exists that integrates into the customer testing system with the flexibility to test multiple types of components.

DESCRIPTION

Machine learning and artificial intelligence applications are now mainstream and finding applications in many fields of technology, including test and measurement instrumentation and systems. The embodiments involve a test and measurement system including a software application platform that supports machine learning training and run time. The platform provides support for debugging for problems and measurements associated with waveforms and the many digital signal processing (DSP) transforms needed to put waveforms into a form suitable for machine learning. The embodiments provide synchronization with user test automation software. One example application of the platform may be integrating machine learning into the calibration, characterization, or testing processes on a manufacturing line, for example in the tuning process for optical transmitters or transceivers. Many other applications are possible.

Figure 1:
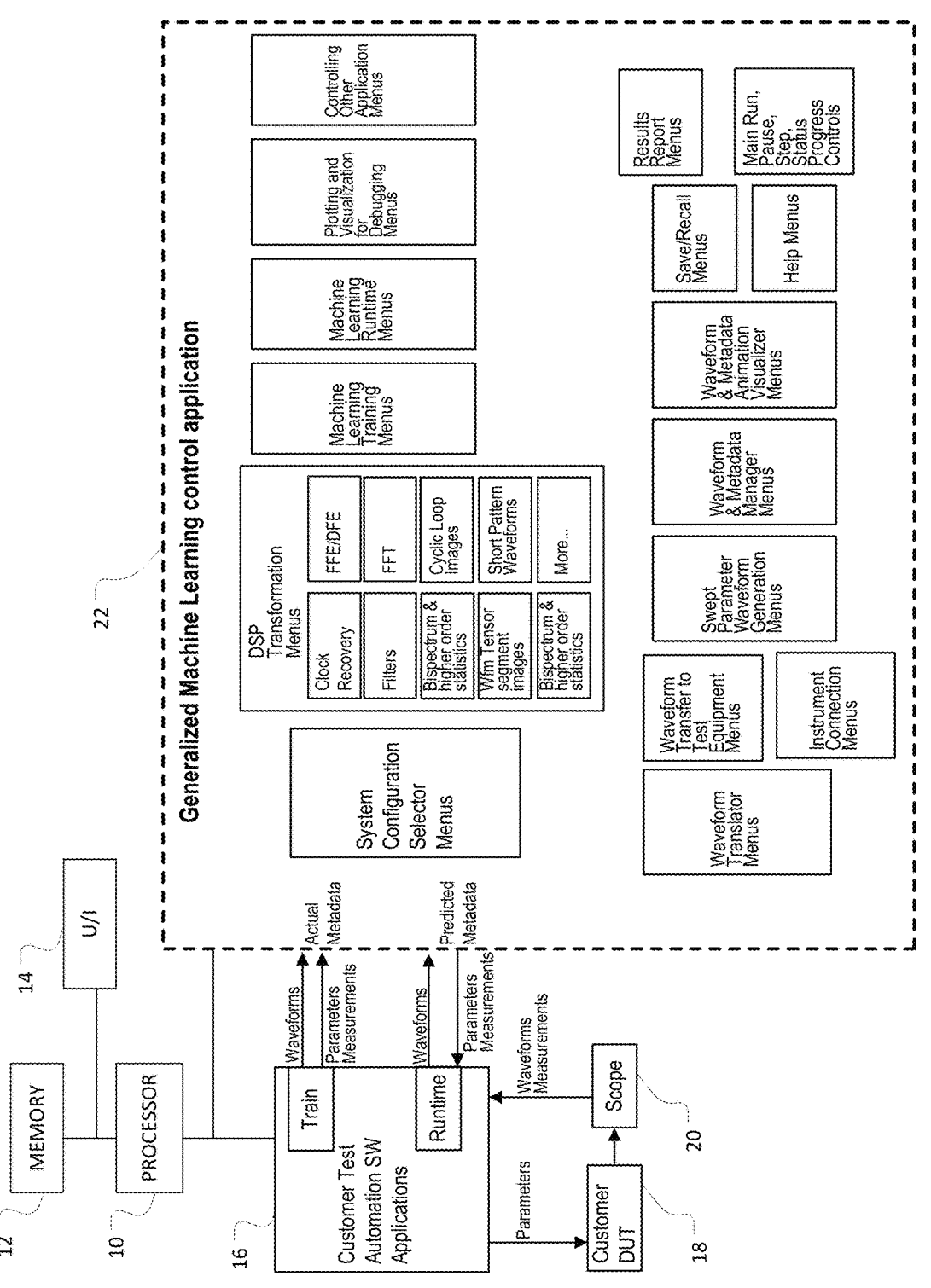
FIG. 1 shows an embodiment of a test and measurement system.

FIG. 1 shows a block diagram of an embodiment of a test and measurement system including the software application platform. In some of the embodiments, the customer's software application controls manufacturing or a test process as part of a closed loop system for performing machine learning training and for performing the runtime operation of the machine learning. The customer application ("Customer Test Automation SW Application") 16 in FIG. 1, referred to here as the "customer app" controls temperature, optical or electrical switches, test and measurement instruments such as spectrum analyzers, oscilloscopes, BERTs (Bit Error Ratio Tests), and/or other items.

The embodiments have flexibility to make it useful for many types of systems that would make use of machine learning.

An example of tuning optical transmitter parameters on the manufacturing line illustrates the closed loop operation. The customer test automation app would set up the system to acquire waveforms. It would then store a set of metadata. In this example, the metadata would comprise transmitter tuning parameters loaded into the transmitter. For the training cycle, the customer app collects the acquired waveform and the associated metadata and transfers it into the platform described in this disclosure, the "Generalized Machine Learning control application" in FIG. 1, which includes a configurable and trainable machine learning system such as a neural network. This discussion may also refer to this as the "ML control app". The customer app would sweep different parameters settings and repeat the training steps until enough data has been obtained to train the neural network.

During runtime on the manufacturing line, the customer app, or test automation system, has the task of tuning the transmitter. It sets the transmitter parameters and collects an output waveform from the transmitter. The customer app sends only the waveform to the ML control app. The machine learning system then observes the waveform and determines what the customer should use for the next iteration of setting the tuning parameters. This closed loop operation optimizes the tuning of the transmitter in less time than previously employed, conventional methods.

In FIG. 1, the test and measurement system has one or more processors represented by processor 10, memory 12 that may store the code executed by the one or more processors to run the customer test automation system 16, and the ML app, or ML system, 22. The system will generally include a device under test (DUT) 18, such as the optical transmitters mentioned above, and a test and measurement device 20, such as an oscilloscope or "scope." While the figure shows a scope, the system may include other types of test and measurement devices. The test automation system passes the waveforms, parameters and/or measurements to the machine learning system during training, where the parameters and/or measurements are included in the metadata. During runtime the waveforms are sent to the machine learning system and it returns the result to the test automation system.

One should note that the one or more processors that run the customer app and the ML app may reside on a same computing device or may reside on two different computing devices, one for the customer app and one for the machine learning system. One of those computing devices may comprise a test and measurement device. Any device with a processor configured to, and capable of, executing the code for one or both applications.

In the following discussion, the figures illustrate menus displayed to a user on a user interface 14. The menus demonstration of the various capabilities and options of the system executed by a combination of the applications. While the discussion focuses on the menus, one should note that the options provided on the menus represent code that when executed by the processor causes the system to perform the task or function identified by the option.

The main basis of the test and measurement system lies in the acquisition of waveforms. The system usually acquires these from a test and measurement device, but could also acquire them from a memory, local memory such as on a test and measurement device, across a network, or from a designated location such as a folder. In addition, the test automation system provides actual metadata associated with each waveform as an input during training. This input metadata may comprise anything useful to classify a waveform in some manner. The input metadata may include many different types of information. They may include transmitter tuning parameters, the various parameters in the transmitter register used to send the waveform. There may be dozens, or even hundreds of parameters. Other examples of metadata include, without limitation temperature read from a temperature on the device transmitting the waveform, humidity, any type of measurement made on the waveform, the bandwidth of the response of the waveform data, an estimate of the transfer function of the media through which the waveform was transmitted, noise on the waveform, noise of the test and measurement device used to create or acquire the waveform, average optical power, jitter, etc.

Figure 2:
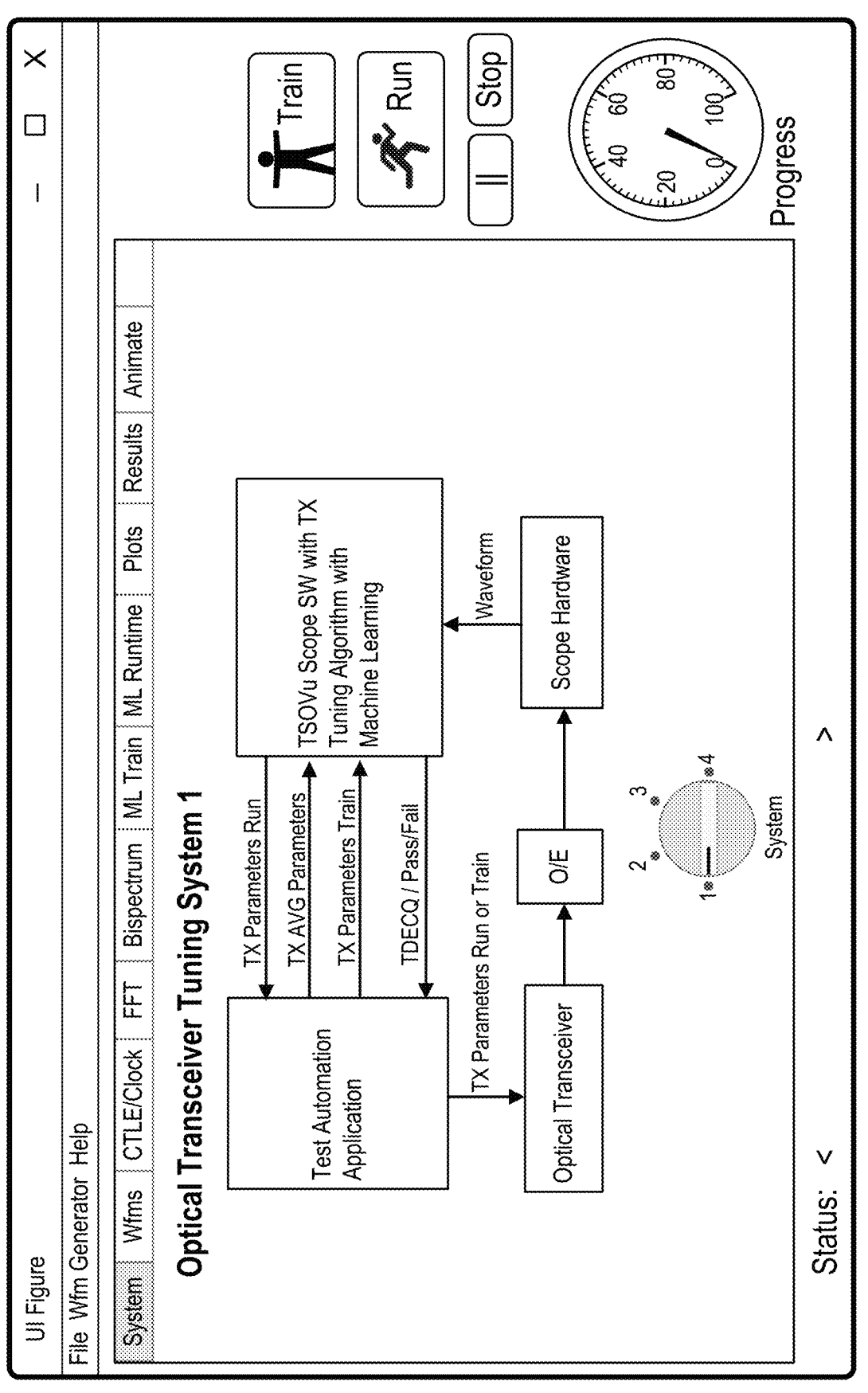
FIGS. 2-5 show embodiments of user interfaces for different system configurations.

FIG. 1 includes system configuration selection menus for the machine learning control application. This menu allows the user to select the specific type of machine learning system configuration for the current test environment or process. For example, the user may select an optical transmitter tuning system as shown in FIG. 2. As one can see by FIG. 2, the screen has several tabs across the top, and these figures show some options for the System tab. In some embodiments, the user interface may display a block diagram of the selected system configurations, as show in FIGS. 2-5, which may aid a user in understanding the operation of, and data flow within, the system.

Figure 3:
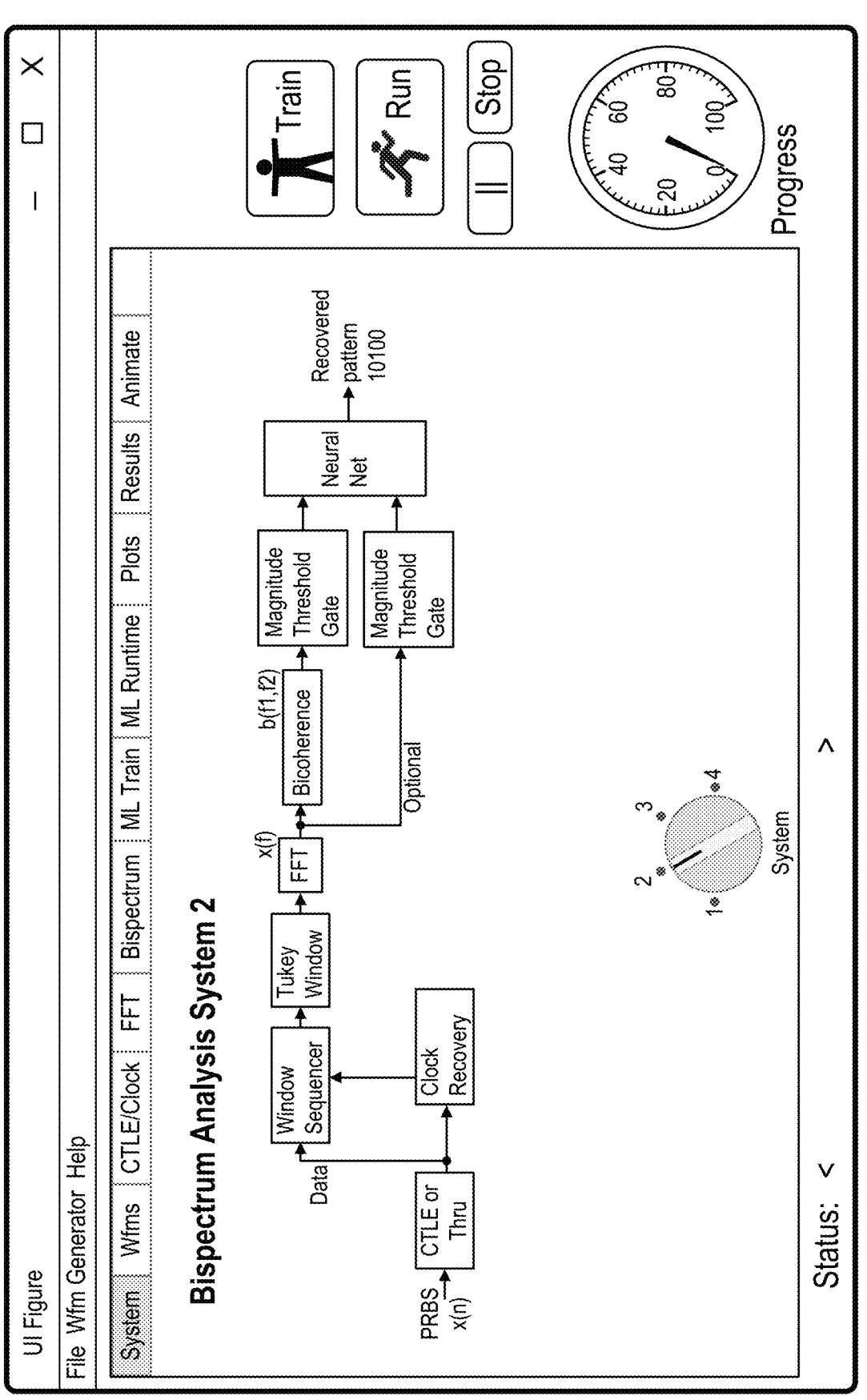
Figure 4:
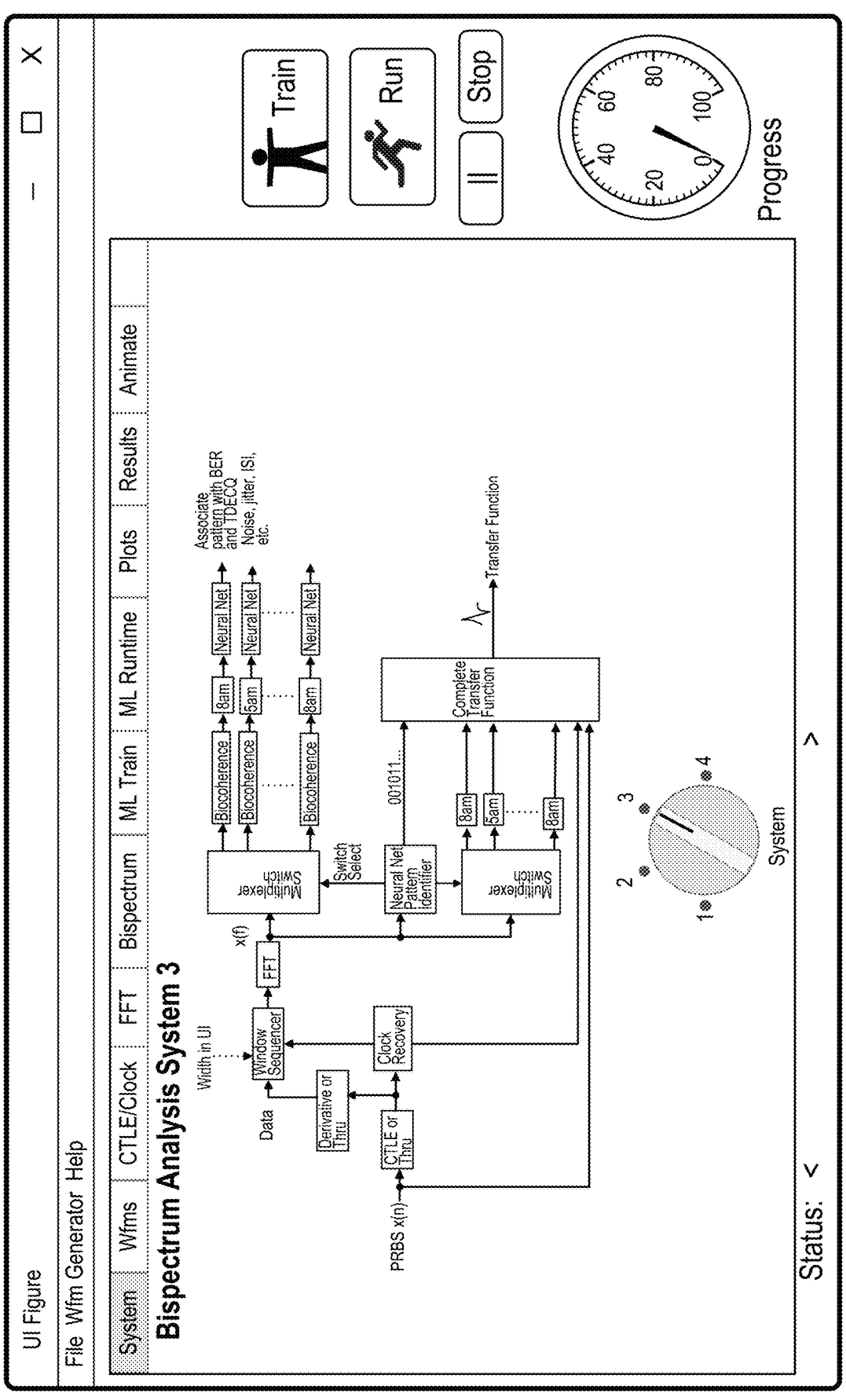
Figure 5:
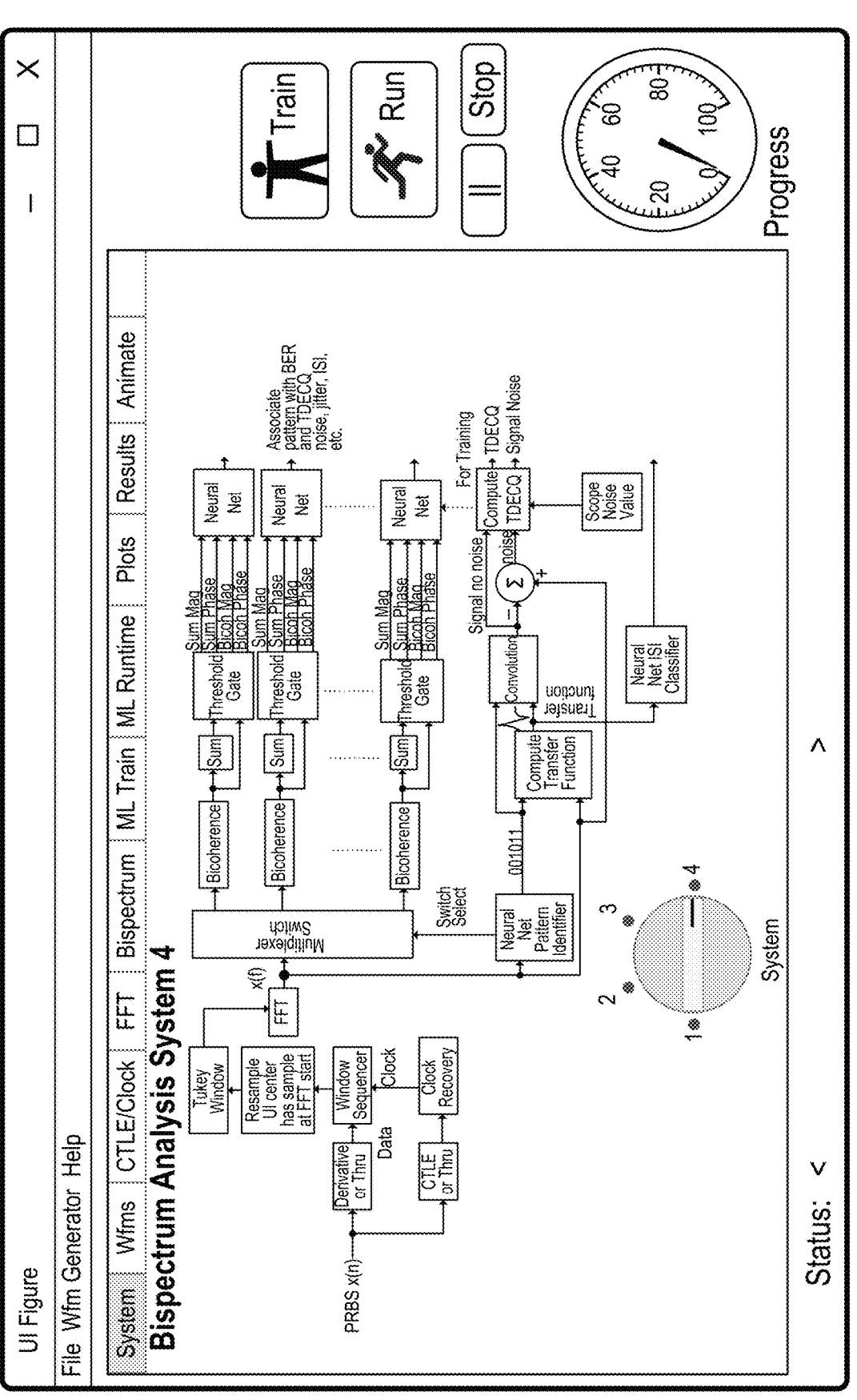

An example showing the measurement system using bicoherence images. FIGS. 3-5 show different selections of different types of bicoherence systems. Many types of systems can be added to use in this system configuration selection menu. This menu block enables the system to be generalized. System configurations may be somewhat analogous to system templates. User selection of a particular system type may pre-select or pre-configure other blocks within the system, for example, pre-selection of a particular waveform DSP transformation to be applied to an input waveform shown in the DSP Transformation Menus shown in FIG. 1.

These allow the user to select various transformations to apply to the waveform to prepare the data for use as input to the machine learning training processes. These may include, without limitation equalization such as applying feed forward equalization (FFE), decision feedback equalization (DFE) or other filters, applying a Bessel-Thompson filter, and performing bispectrum analysis. One should note that US Pat. Pub. No. 2021/0081630 discusses bispectrum analysis and is incorporated by reference herein in its entirety. Other transformations may include selection of the type of waveform creation. This may include, without limitation, cyclic loops image tensor creation, discussed in U.S. patent application Ser. No. 17/345,312, filed Jun. 11, 2021, particular classes of eye diagrams, discussed in U.S. patent application Ser. No. 17/592,437, filed Jun. 3, 2022, and a waveform image tensor database, discussed in U.S. patent application Ser. No. 17/747,954, filed May 18, 2022. As mentioned above, US Pat. App. Pub. No. 2021/0081630 discusses bispectrum images, bicoherence images, higher order statistics images and higher order statistic data. These patent applications are incorporated by reference herein in their entirety.

Clock recovery comprises another option for the waveform transformation. The application is general and as such, other system schematic diagrams may be added, which require DSP processing blocks that are not mentioned in this disclosure. Future DSP algorithms may be added to support future systems that added to the application.

Figure 6:
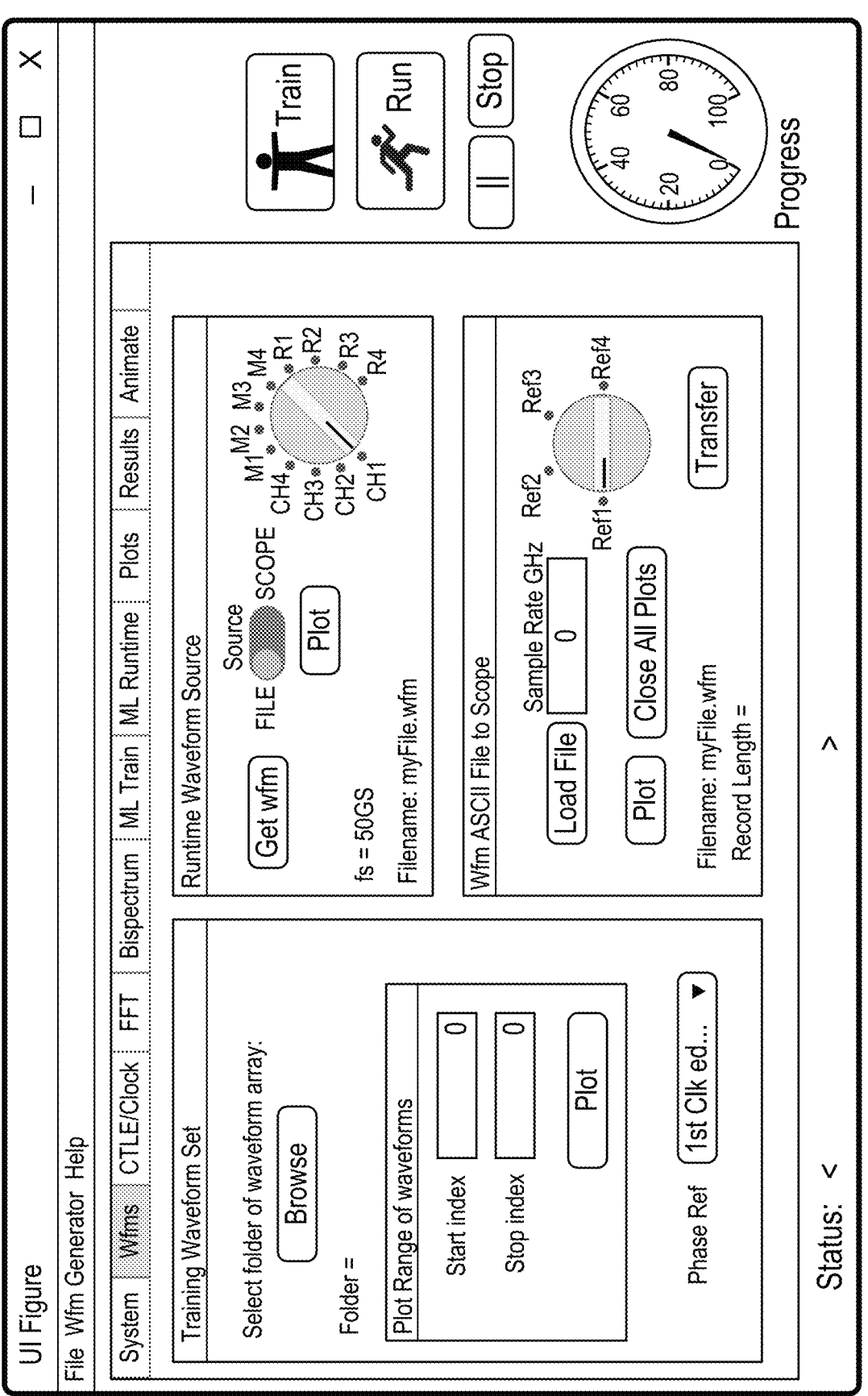
FIG. 6 shows an embodiment of a waveform management menu.
Figure 7:
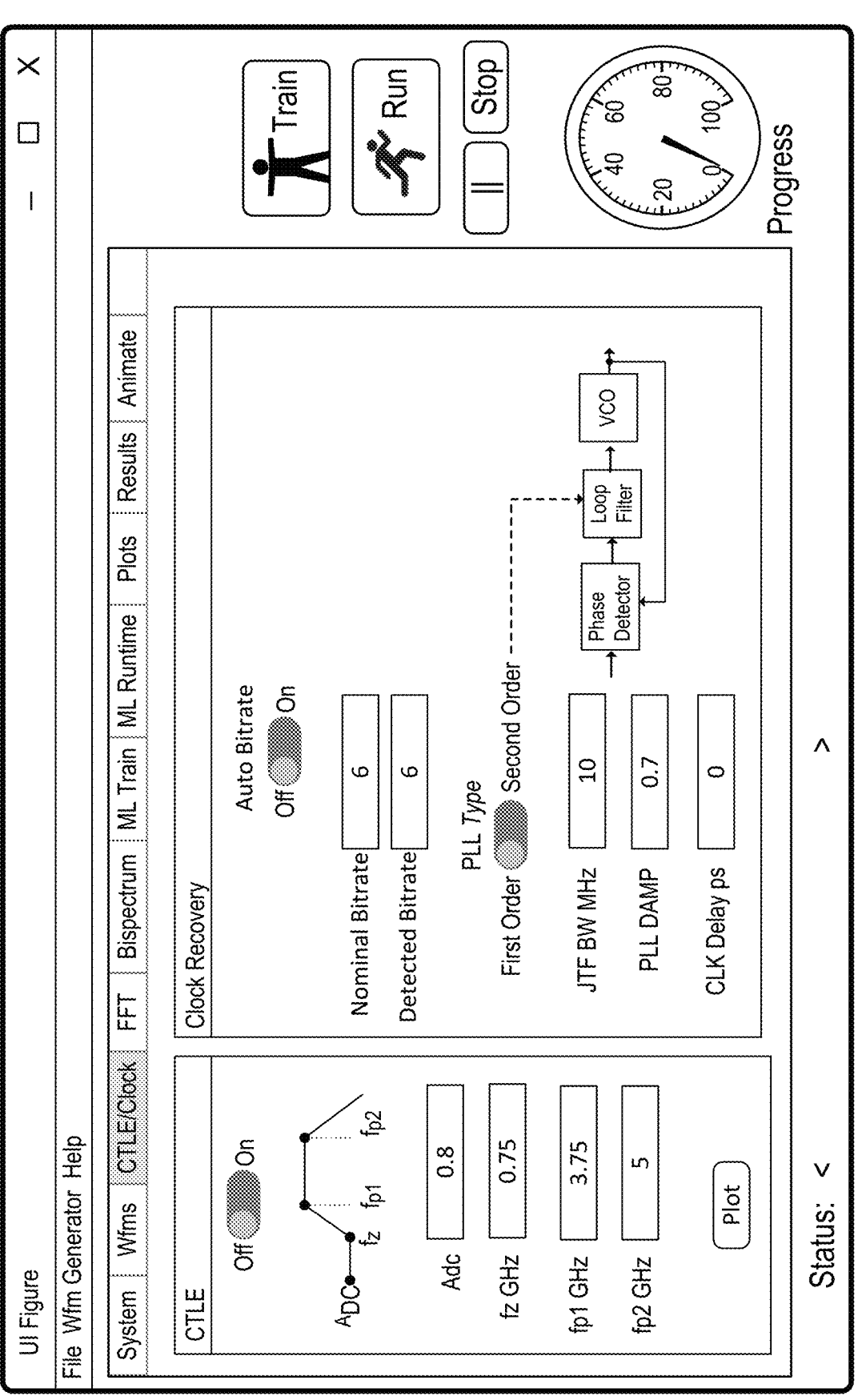
FIG. 7 shows an embodiment of a continuous time linear equalizer (CTLE)/clock recovery menu.
Figure 8:
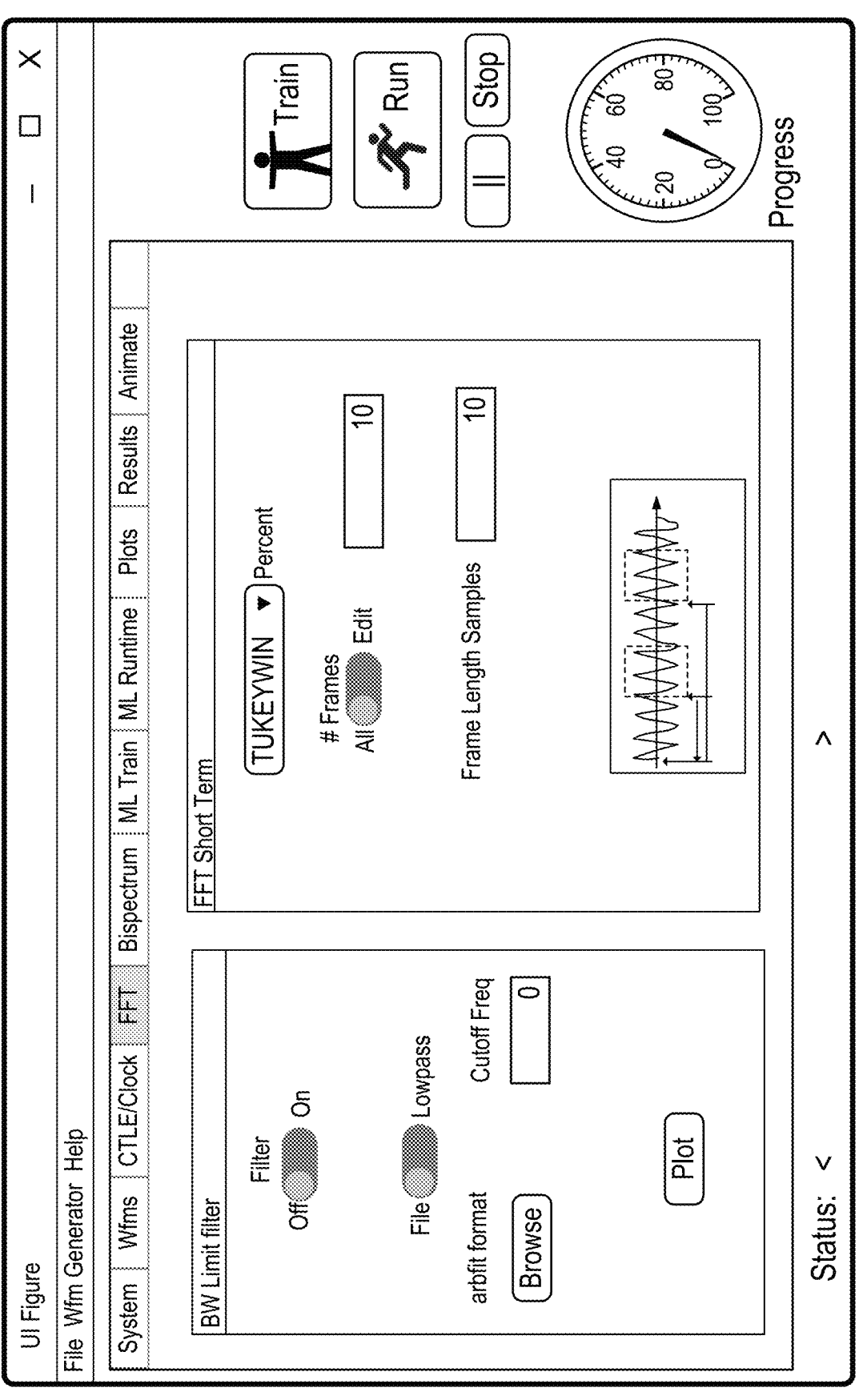
FIG. 8 shows an embodiment of a Fast Fourier Transform (FFT) controls menu.
Figure 9:
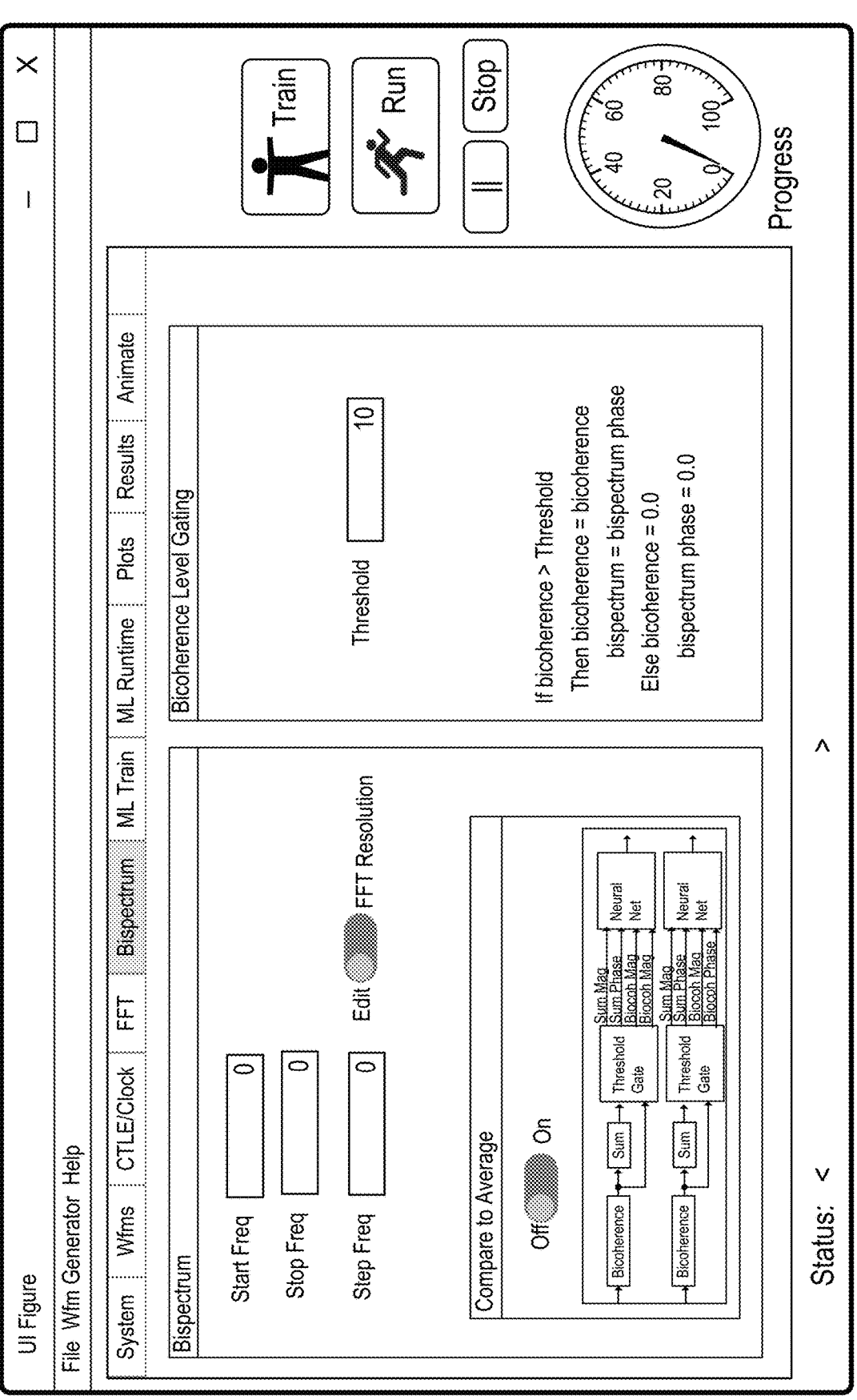
FIG. 9 shows an embodiment of a bispectrum and bicoherence controls menu.

FIG. 6 shows an embodiment of a waveform management menu, the next tab in the user interface. FIG. 7 shows an embodiment of a continuous time linear equalizer (CTLE) and Clock Recovery menu. FIG. 8 shows an embodiment of a Fast Fourier Transform (FFT) menu. FIG. 9 shows an embodiment of Bispectrum analysis settings.

Figure 10:
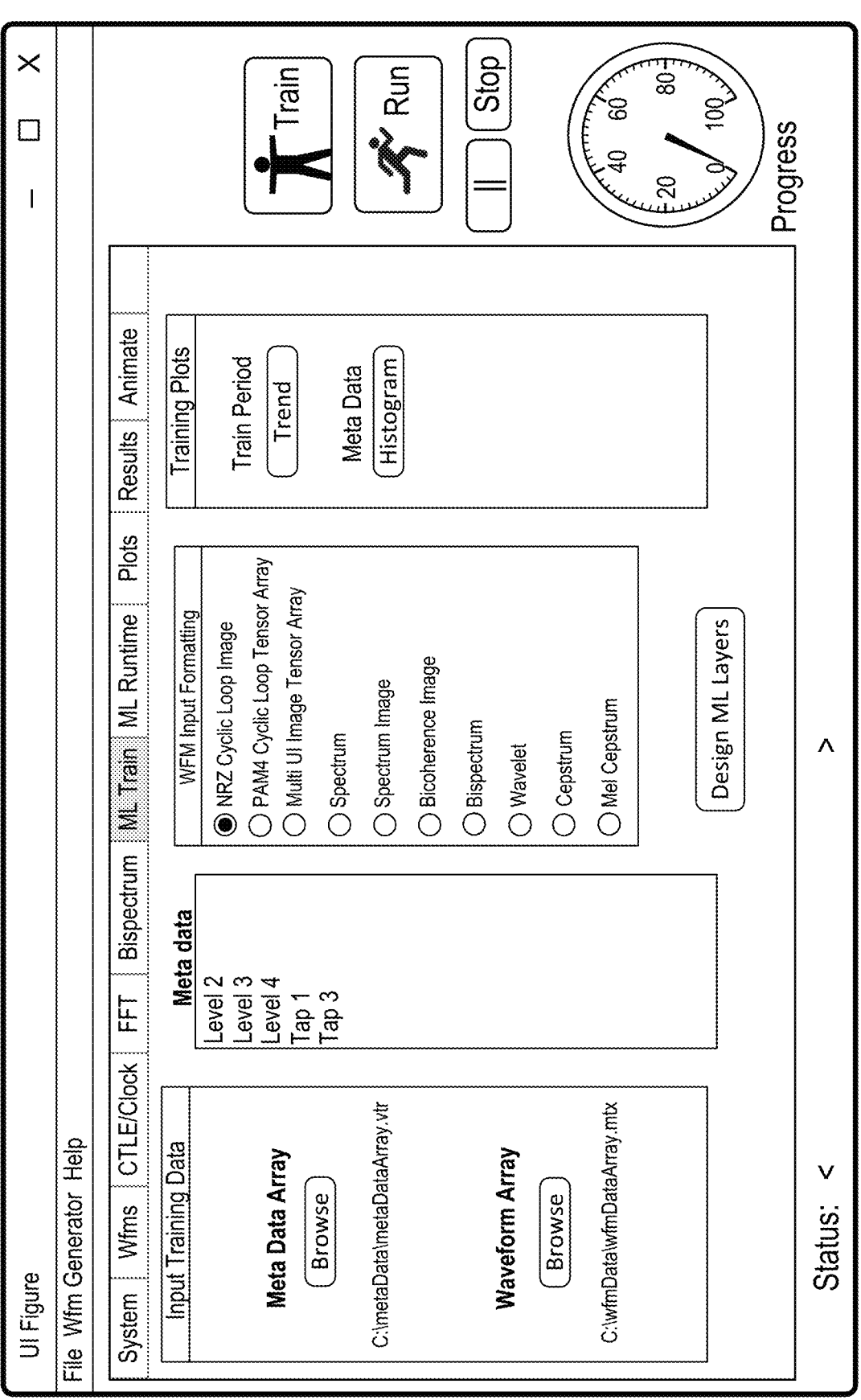
FIG. 10 shows an embodiment of a machine learning training menu.

Returning to the FIG. 1, the system also provides user selections for ML training and runtime options. FIG. 10 shows an embodiment of a ML training menu. One should also note that the user interface allows the user to select to Train or Run the ML system, as well as pause or stop the process, with a progress meter. This part of the system allows the user to setup the type of machine learning network, and the organization of input data and output data needed from the network for the current task. This requires the user application to acquire waveform data and feed that along with actual metadata to the ML block for each step of the tuning process. The system may perform this sequentially with each step acquisition of a waveform, or by storing a large set of waveforms and metadata and handing that over to the ML block. The menu may include Training Plots, updated during the training process to show the progress and the accuracy of the training. The menu may also include block diagram images that show the network layer configuration and allow the user to control configuration and setup up whenever a neural network algorithm ML is chosen. The menu may include other support menus for ML systems other than neural networks.

Figure 11:
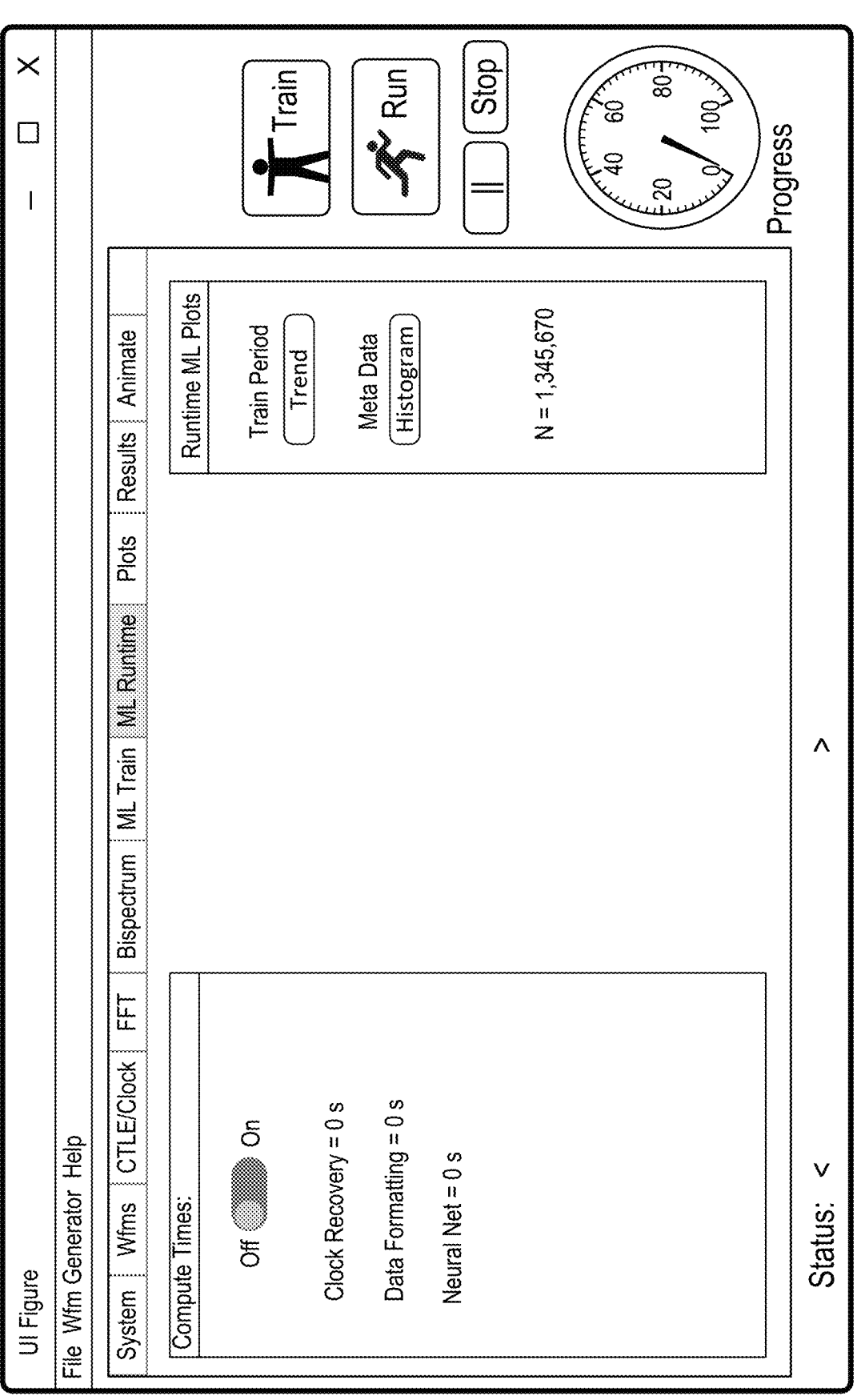
FIG. 11 shows an embodiment of a machine learning runtime menu.

FIG. 11 shows an embodiment of a ML runtime menu. This part of the system allows the user to setup and control the runtime usage of the machine learning system. As mentioned above, this may reside on a manufacturing line of the customer, but is not limited to that usage. At runtime, the test automation system acquires the waveform data and send that to the machine learning system without metadata, and then receive predicted metadata as an output from the machine learning block. The predicted metadata differs from the input metadata associated with the input waveform used during training. The machine learning system may store the output metadata in a predetermined location for the test automation system to access.

In addition, the system may include evaluation menus. These allow the user to evaluate the machine learning results and enable user to choose best path, a block displays test result accuracy for each of the chosen ML techniques selected using a set of input test data. This allows the user to see accuracy results for a variety of models and choose the optimal combination of ML algorithm and feature selection.

Figure 12:
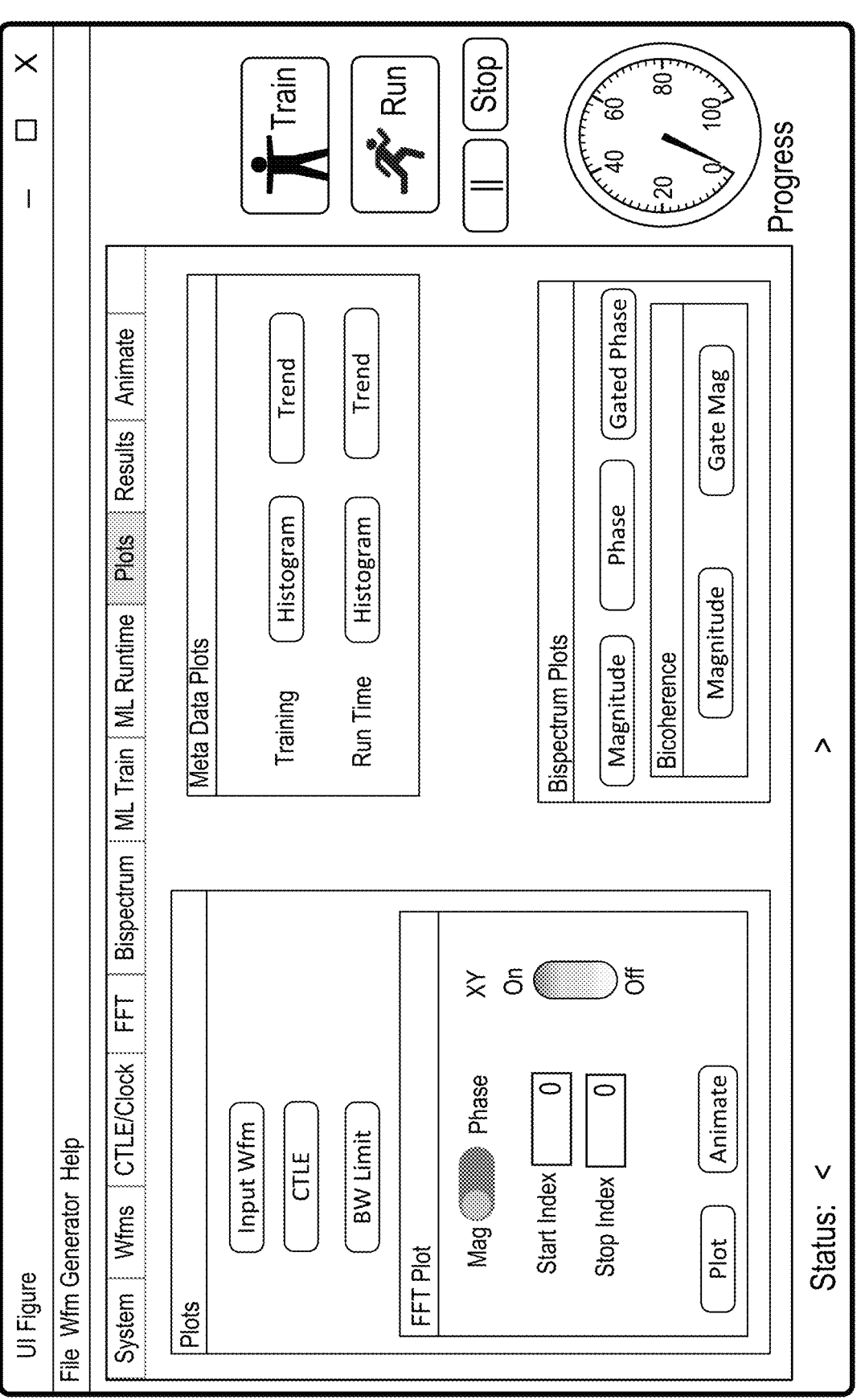
FIG. 12 shows an embodiment of a menu for selecting plots for display.
Figure 13:
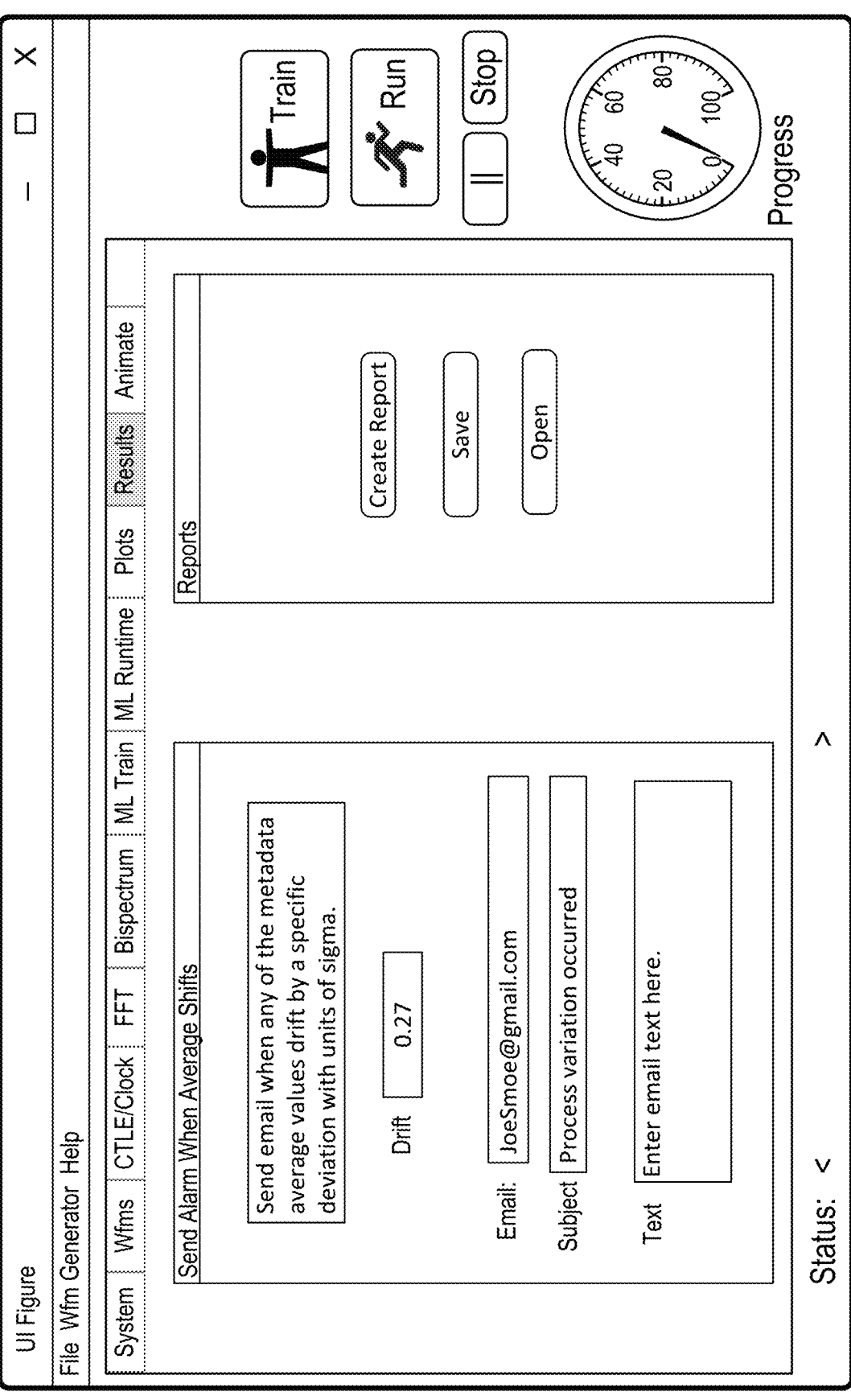
FIG. 13 shows an embodiment of a results menu.

FIG. 12 shows an embodiment of a menu for the Plots tab. This menu allows the user to plot and visualize waveform data and metadata in any desired form. This may have uses in debugging and verification of the system. In addition to these plots, the system may provide the user the ability to see results in other forms, such as shown in FIG. 13.

Figure 14:
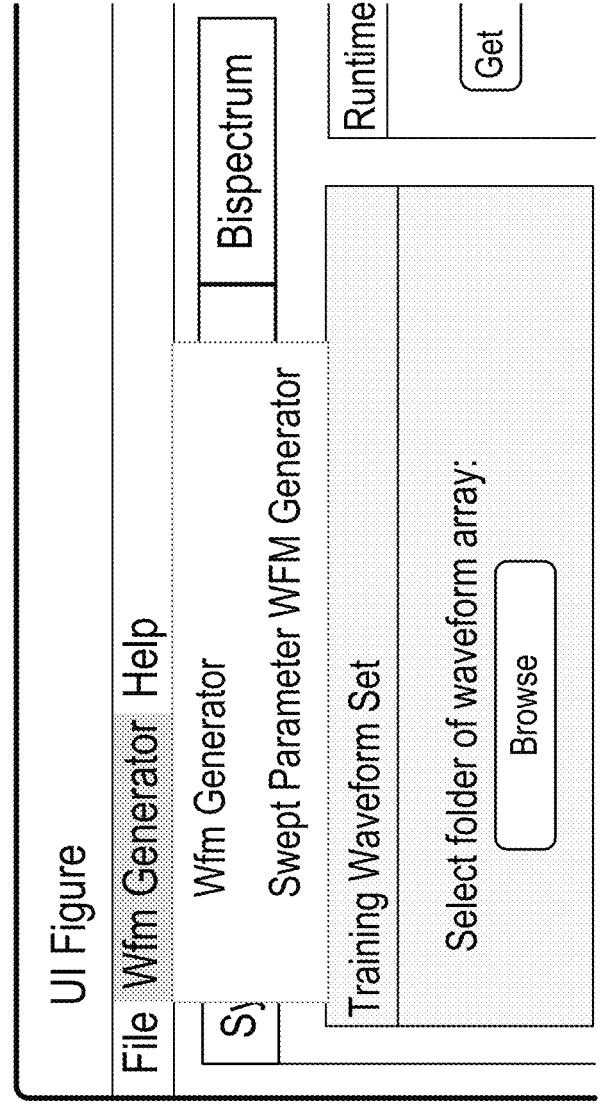
FIG. 14 shows an embodiment of a simulated waveform generator menu.
Figure 15:
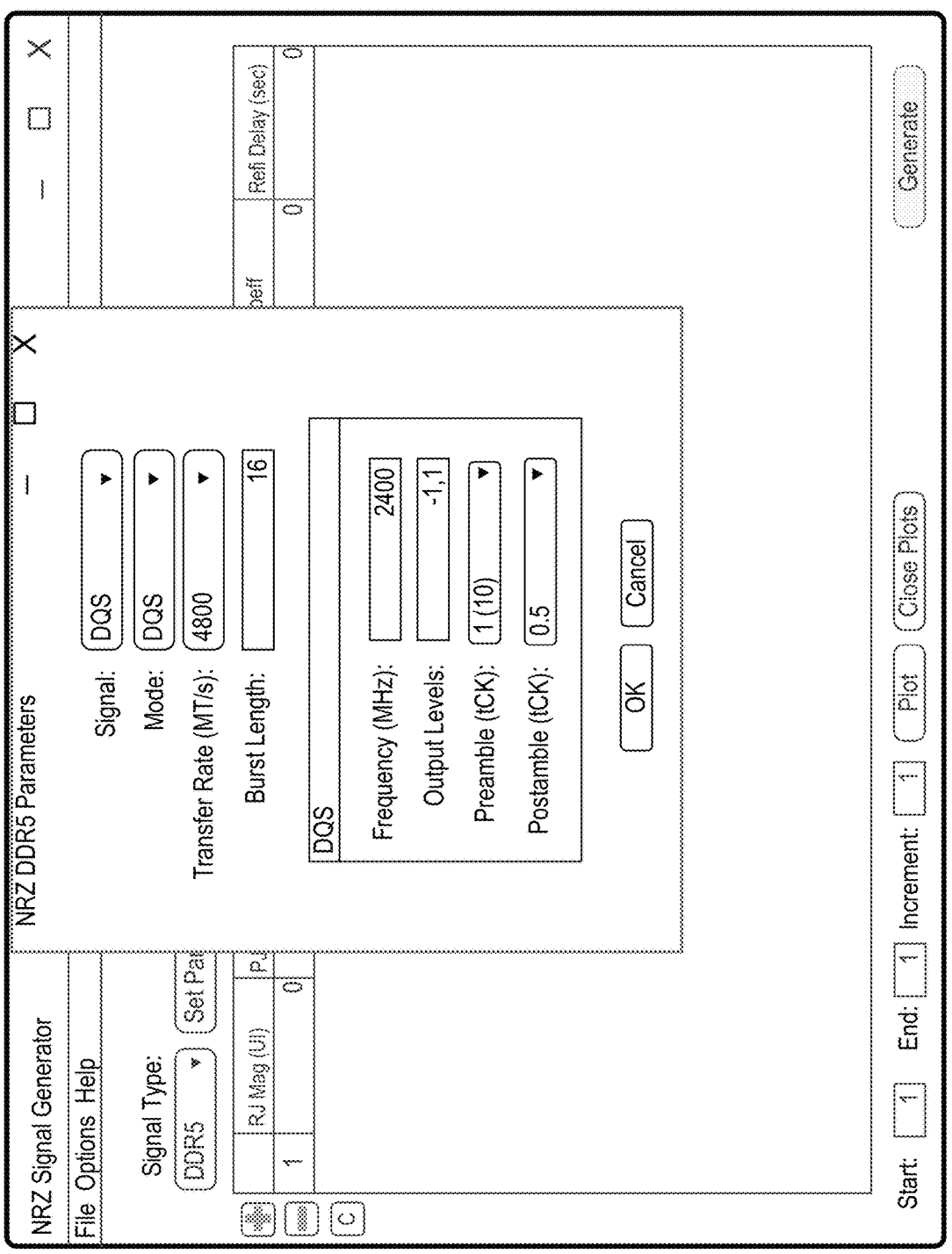
FIG. 15 shows an embodiment of a menu for swept parameters in a simulated waveform generator.
Figure 16:
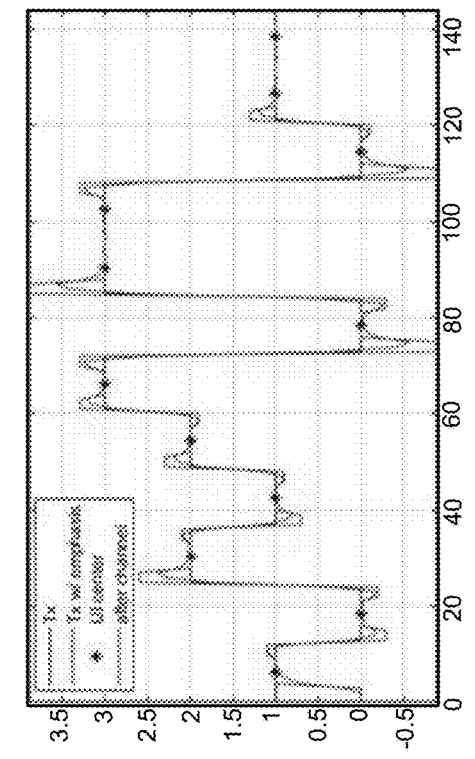
FIG. 16 shows examples of PAM4 swept parameter generator output simulated waveforms.
Figure 16:
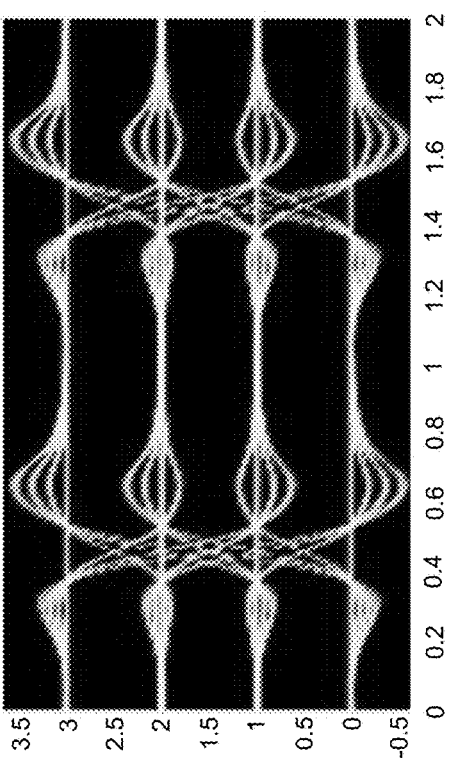

As one can see in any of the previous menus, at the top of the user interface, above all of the tabs previously discussed, there is a selection for Wfrm Generator as shown in FIG. 14. This allows the user to manage a simulated waveform tool to generate test waveforms for the purpose of training the ML system using simulated data rather than actual live data. It allows the user to setup sweep of various parameters that affect the shape of the waveform as well as introducing impairments to signal for the tuning of training models. FIG. 15 shows an embodiment of a swept parameters menu. FIG. 16 shows examples of a PAM4 (Pulse Amplitude Modulation-4 level) simulated waveforms for a swept parameter.

Another aspect of the machine learning system allows the user to animate the waveform. This allows the user to put each waveform and or its transformation image along with metadata into a single image movie frame for each swept parameter value.

Returning to FIG. 1, one can see that other capabilities with regard to the waveform data exist. A waveform manager allows the user to easily setup various aspects of organizing and managing the waveform data and the metadata. The system may have several thousand waveforms required for training.

As discussed above, the system may include one or more test and measurement devices. The waveform translator allows the user to direct the system to transform the waveform from any type of supported test equipment, such as test equipment from different manufacturers, into a format more suitable for the machine learning system. Similarly, the system may include the ability to transfer waveforms to any piece of supported test instrument for display, and/or measurement, analysis or for performing other transforms on the waveform data. This may include using programmatic interface (PI) commands to connect to the supported test equipment in the Instrument Connection Menus shown in FIG. 1. PI commands may also be used for automation control.

In addition to connecting to other instruments, the ML system may have a menu that allows the ML system to control and setup other software applications. For an example, the ML system may set up and run jitter analysis software such as DPOJET, a real-time period, frequency, jitter and timing analysis tool developed by Tektronix. The ML system would have built in PI commands to transfer the waveforms to a test and measurement device, and set up the jitter analysis application to display eye diagrams and make jitter and other measurements. The ML system would then receive the measurements back from the application and use them as metadata for waveform classification.

Figure 17:
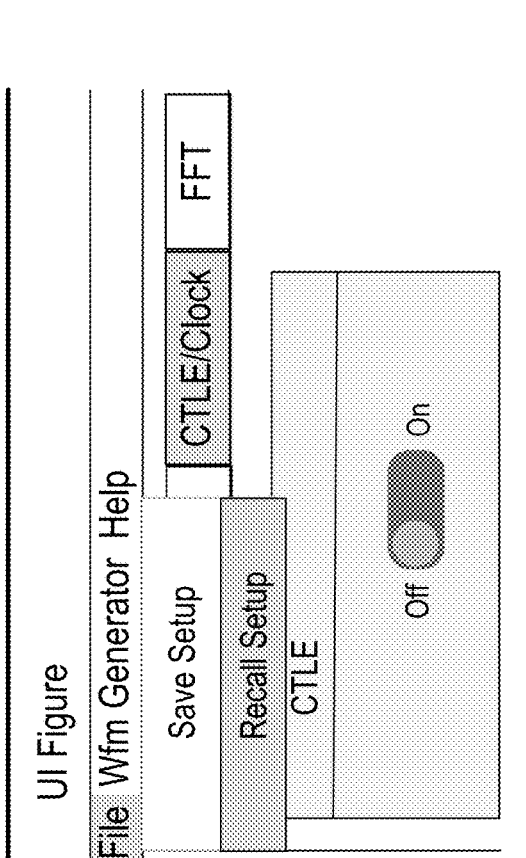
FIG. 17 shows an embodiment of a save and recall menu.
Figure 18:
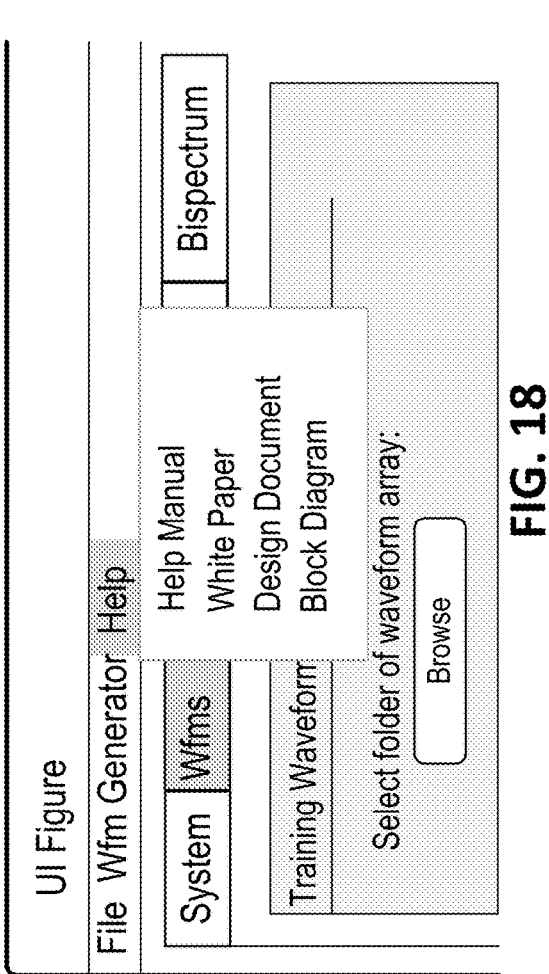
FIG. 18 shows an embodiment of a help menu.

The ML system would also have general support menus, such as menu to allow the user to first save, and then later recall, the setup used in a particular configuration of the system, as shown in FIG. 17. The ML system may also include a help menu such as shown in FIG. 18. The help menu may provide text and links to reference papers or research papers to aid the user in using this application.

Another part of the ML system would allow for the user to setup notifications for events in the operation of the system. For example, the system may include a process deviation notification. The system would determine an average value of each predicted metadata output from the ML analysis. If the average begins to drift over some period of time a trigger will occur to send email, or other type of alert, to notify of the event. This provides only one example of the types of actions provided by this menu.

As discussed above, this ML system provides a platform for many different types of machine learning processes to perform analysis of devices under test and provide results, such as tuning results and measurements based upon the waveforms submitted during runtime. The ML system allows for flexibility, has expandable capabilities and provides a framework for many future applications.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement system, comprising: a machine learning system configured to communicate with a test automation system; a user interface configured to allow a user to provide one or more user inputs and to provide results to the user; and one or more processors, the one or more processors configured to execute code that causes the one or more processors to: receive one or more user inputs through the user interface, the one or more user inputs at least identifying a selected machine learning system configuration to be used to configure the machine learning system; receive a waveform created by operation of a device under test; apply the configured machine learning system to analyze the waveform; and provide an output of predicted metadata about the waveform.

Example 2 is the test and measurement system of Example 1, wherein the code that causes the one or more processors to receive the waveform comprises code that causes the one or more processors to either receive the waveform from the test automation system or retrieve the waveform from a memory.

Example 3 is the test and measurement system of Example 2, wherein the code that causes the one or more processors to retrieve the waveform from the memory comprises code that causes the one or more processors to retrieve the waveform from one of a memory on a test and measurement device, a local memory, or a remote memory.

Example 4 is the test and measurement system of any of Examples 1 through 3, wherein the one or more user inputs identifying a selected machine learning system configuration comprises a user input identifying one of an optical transceiver testing system or a bispectrum analysis system.

Example 5 is the test and measurement system of any Examples 1 through 4, wherein the one or more processors are further configured to execute code that causes the one or more processors to transform the waveform to prepare the waveform data for use in the machine learning system.

Example 6 is the test and measurement system of Example 5, wherein the code that causes the one or more processors to transform the waveform comprises code that causes the one or more processors to perform at least one of applying equalization to the waveform, applying a Bessel Thompson filter, performing bispectrum analysis, generating higher order statistical data, and providing clock recovery options.

Example 7 is the test and measurement system of Example 5, wherein the code that causes the one or more processors to transform the waveform comprises code that causes the one or more processors to generate a waveform image of one of a cyclic loop image tensor, one or more subsets of a classic eye diagram, a waveform segment image tensor array, short pattern waveforms, a bispectrum image, a bicoherence image, and a higher order statistics image.

Example 8 is the test and measurement system of any of Examples 1 through 7, wherein the one or more processors are further configured to execute code that causes the one or more processors to display a waveform management menu to the user, receive user selections through the user interface, and organize the input waveforms and waveform metadata according to the user selections.

Example 9 is the test and measurement system of any of Examples 1 through 8, wherein the one or more processors are further configured to execute code that causes the one or more processors to translate the waveform from a test and measurement device or to transmit the waveform to a test and measurement device.

Example 10 is the test and measurement system any of Examples 1 through 9, wherein the one or more processors are further configured to execute code that causes the one or more processors to train the machine learning system by receiving waveform input metadata relating to the waveform and provide the waveform and waveform input metadata to the machine learning system for training.

Example 11 is the test and measurement system of Example 10, wherein the code that causes the one or more processors to train the machine learning system comprises code that causes the one or more processors to train the machine learning system one of either sequentially with each step acquisition of the waveform, or by storing a set of waveforms and waveform input metadata and providing the set to the machine learning system for training.

Example 12 is the test and measurement system of Example 10, wherein the code that causes the one or more processors to train the machine learning system comprises code that causes the one or more processors to display and update plots showing progress and accuracy of the training.

Example 13 is the test and measurement system of Example 10, wherein the code that causes the one or more processors to train the machine learning system comprises code that causes the one or more processors to generate simulated test waveforms, the simulated test waveforms including at least one of swept parameters and impairments to signals.

Example 14 is the test and measurement system of Example 10, wherein the code that causes the one or more processors to train the machine learning system comprises code that causes the one or more processors to display accuracy of the selected machine learning system configuration resulting from a set of input test data.

Example 15 is the test and measurement system of any of Examples 1 through 14, wherein the one or more processors are further configured to execute code that causes the one or more processors to display a plot, the waveform and the output metadata.

Example 16 is the test and measurement system of any of Examples 1 through 15, wherein the one or more processors are further configured to execute code that causes the one or more processors to average values of the output metadata, compare the value to a drift threshold, and provide a notification if the average values exceed the drift threshold.

Example 17 is the test and measurement system of any of Examples 1 through 16, wherein the one or more processors are further configured to execute code that causes the one or more processors to: display a main menu having user inputs to allow the user to start, stop or pause the machine learning system running or training; and display a status output including information related to at what point the machine learning system is operating.

Example 18 is the test and measurement system of any of Examples 1 through 17, wherein the one or more processors are further configured to execute code that causes the one or more processors to establish connection to test equipment selected by the user, and to transfer waveforms to the test equipment.

Example 19 is the test and measurement system of Example 18, wherein the one or more processors are further configured to execute code that causes the one or more processors to execute programmatic instructions to allow automation control.

Example 20 is the test and measurement system of any of Examples 1 through 19, wherein the one or more processors are further configured to execute code that causes the one or more processors to execute and control other code that causes the one or more processors to perform jitter analysis on waveforms.

Example 21 is the test and measurement system of any of Examples 1 through 20, wherein the one or more processors are further configured to execute code that causes the one or more processors to save and recall application set ups for the test and measurement system.

Example 22 is the test and measurement system of any of Examples 1 through 21, wherein the one or more processors are further configured to execute code that causes the one or more processors to produce results reports.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement system, comprising:
a machine learning system, comprising one or more neural networks;
a test automation system comprising:
a user interface configured to allow a user to provide one or more user inputs and to provide results to the user; and
one or more processors, the one or more processors configured to execute code that causes the one or more processors to:
receive one or more user inputs through the user interface, the one or more user inputs at least identifying a selected machine learning system configuration to be used;
receive a waveform created by operation of a device under test (DUT);
send the waveform as an input to the machine learning system having the selected machine learning system configuration;
receive an output of predicted metadata that includes at least one next tuning parameter for the device under test;
using the at least one tuning parameter to set parameters for the DUT for a next test; and
performing the next test.

2. The test and measurement system as claimed in claim 1, wherein the code that causes the one or more processors to receive the waveform comprises code that causes the one or more processors to either receive the waveform from a test and measurement instrument in the test and measurement system or retrieve the waveform from a memory.

3. The test and measurement system as claimed in claim 2, wherein the code that causes the one or more processors to retrieve the waveform from the memory comprises code that causes the one or more processors to retrieve the waveform from one of a memory on a test and measurement device, a local memory, or a remote memory.

4. The test and measurement system as claimed in claim 1, wherein the one or more user inputs identifying a selected machine learning system configuration comprises a user input identifying one of an optical transceiver testing system or a bispectrum analysis system.

5. The test and measurement system as claimed in claim 1, the one or more processors being further configured to execute code that causes the one or more processors to transform the waveform to prepare data of the waveform for use in the machine learning system.

6. The test and measurement system as claimed in claim 5, wherein the code that causes the one or more processors to transform the waveform comprises code that causes the one or more processors to perform at least one of apply equalization to the waveform, apply a Bessel Thompson filter, perform bispectrum analysis, generate higher order statistical data, and provide clock recovery options.

7. The test and measurement system as claimed in claim 5, wherein the code that causes the one or more processors to transform the waveform comprises code that causes the one or more processors to generate a waveform image of one of a cyclic loop image tensor, one or more subsets of a classic eye diagram, a waveform segment image tensor array, short pattern waveforms, a bispectrum image, a bicoherence image, and a higher order statistics image.

8. The test and measurement system as claimed in claim 1, the one or more processors being further configured to execute code that causes the one or more processors to display a waveform management menu to the user, receive user selections through the user interface, and organize the input waveforms and waveform metadata according to the user selections.

9. The test and measurement system as claimed in claim 1, the one or more processors being further configured to execute code that causes the one or more processors to translate the waveform from a test and measurement device or to transmit the waveform to a test and measurement device.

10. The test and measurement system as claimed in claim 1, the one or more processors being further configured to execute code that causes the one or more processors to train the machine learning system by receiving waveform input metadata relating to the waveform and provide the waveform and waveform input metadata to the machine learning system for training.

11. The test and measurement system as claimed in claim 10, wherein the code that causes the one or more processors to train the machine learning system comprises code that causes the one or more processors to train the machine learning system one of either sequentially with each step acquisition of the waveform, or by storing a set of waveforms and waveform input metadata and providing the set to the machine learning system for training.

12. The test and measurement system as claimed in claim 10, wherein the code that causes the one or more processors to train the machine learning system comprises code that causes the one or more processors to display and update plots showing progress and accuracy of the training.

13. The test and measurement system as claimed in claim 10, wherein the code that causes the one or more processors to train the machine learning system comprises code that causes the one or more processors to generate simulated test waveforms, the simulated test waveforms include at least one of swept parameters, and impairments to signals.

14. The test and measurement system as claimed in claim 10, wherein the code that causes the one or more processors to train the machine learning system comprises code that causes the one or more processors to display accuracy of the selected machine learning system configuration resulting from a set of input test data.

15. The test and measurement system as claimed in claim 1, the one or more processors being further configured to execute code that causes the one or more processors to display a plot, the waveform and the output metadata.

16. The test and measurement system as claimed in claim 1, the one or more processors being further configured to execute code that causes the one or more processors to average values of the output metadata, compare the value to a drift threshold, and provide a notification if the average values exceed the drift threshold.

17. The test and measurement system as claimed in claim 1, the one or more processors being further configured to execute code that causes the one or more processors to:
  display a main menu having user inputs to allow the user to start, stop or pause the machine learning system running or training; and
  display a status output including information related to at what point the machine learning system is operating.

18. The test and measurement system as claimed in claim 1, the one or more processors being further configured to execute code that causes the one or more processors to establish connection to test equipment selected by the user, and to transfer waveforms to the test equipment.

19. The test and measurement system as claimed in claim 18, the one or more processors being further configured to execute code that causes the one or more processors to execute programmatic instructions to allow automation control.

20. The test and measurement system as claimed in claim 1, the one or more processors being further configured to execute code that causes the one or more processors to execute and control other code that causes the one or more processors to perform jitter analysis on waveforms.

21. The test and measurement system as claimed in claim 1, the one or more processors being further configured to execute code that causes the one or more processors to save and recall application set ups for the test measurement system.

22. The test and measurement system as claimed in claim 1, the one or more processors being further configured to execute code that causes the one or more processors to produce results reports.

* * * * *